(12) United States Patent
Alrutz et al.

(10) Patent No.: US 7,317,758 B2
(45) Date of Patent: Jan. 8, 2008

(54) PCM-TO-PWM CONVERTER

(75) Inventors: Herbert H. Alrutz, Freiburg (DE);
Dieter Lücking, Freiburg (DE);
Matthias Vierthaler, Denzlingen (DE)

(73) Assignee: Micronas GmbH, Freiburg (DE)

( * ) Notice: Subject to any disclaimer, the term of this patent is extended or adjusted under 35 U.S.C. 154(b) by 595 days.

(21) Appl. No.: 10/892,531

(22) Filed: Jul. 14, 2004

(65) Prior Publication Data

US 2005/0046601 A1 Mar. 3, 2005

Related U.S. Application Data

(60) Provisional application No. 60/487,000, filed on Jul. 14, 2003.

(30) Foreign Application Priority Data

Aug. 14, 2003 (DE) ................................ 103 37 782

(51) Int. Cl.
*H03K 7/30* (2006.01)
(52) U.S. Cl. ...................... 375/238; 332/109; 370/205; 341/53
(58) Field of Classification Search ................ 375/238, 375/242, 239; 370/205; 332/109; 341/53
See application file for complete search history.

(56) References Cited

U.S. PATENT DOCUMENTS

| | | | |
|---|---|---|---|
| 5,245,593 A | 9/1993 | Yamate | 368/156 |
| 5,559,467 A | 9/1996 | Smedley | 330/10 |
| 5,617,058 A | 4/1997 | Adrian et al. | 330/10 |
| 5,959,501 A | 9/1999 | Chester | 330/251 |
| 6,014,055 A | 1/2000 | Chester | 330/10 |
| 6,031,481 A | 2/2000 | Craven | |

(Continued)

FOREIGN PATENT DOCUMENTS

GB    2 228 381    8/1990    ........................ 1/8

(Continued)

OTHER PUBLICATIONS

Hiorns et al. "Power digital to analogue width modulation and digital signal processing," IE Proceedings- G Circuits, Devices and Systems, vol. 140, No. 5, 1993, pp. 329-337, Stevenage, GB.

(Continued)

*Primary Examiner*—Kevin Kim
(74) *Attorney, Agent, or Firm*—O'Shea, Getz & Kosakowski, P.C.

(57) ABSTRACT

The invention relates to a method and a device for converting a digital, pulse-coded signal (PCM) to a pulse-width-modulated signal (PWM), wherein the digital signal PCM, f(t) is multiplied by at least one derivative (f'(t), f''(t), ..., $f^{(n)}$ (t)) of the signal (f(t)). The invention also relates to a technique for converting a digital pulse-coded signal (PCM) to a pulse-width-modulated signal (PWM), wherein to obtain a sampling rate sufficient for the pulse-width-modulated signal an oversampling of the digital signal is implemented with a first oversampling factor before the conversion and an second oversampling factor after the conversion, such that the product of the oversampling factors before and after conversion of the digital signal to the pulse-width-modulated signal corresponds at least to the value of the required oversampling factor.

18 Claims, 2 Drawing Sheets

U.S. PATENT DOCUMENTS

| | | | |
|---|---|---|---|
| 6,181,266 B1 | 1/2001 | Toki | 341/152 |
| 6,414,613 B1 | 7/2002 | Midya et al. | 341/143 |
| 6,430,220 B1 | 8/2002 | Determan | 375/238 |
| 6,473,009 B2 | 10/2002 | Grosso et al. | 341/102 |
| 6,473,457 B1 | 10/2002 | Pascual et al. | 375/238 |
| 6,518,838 B1 | 2/2003 | Risbo | 330/10 |
| 6,657,566 B1 | 12/2003 | Risbo et al. | 341/53 |
| 2002/0036579 A1 | 3/2002 | Grosso et al. | 341/144 |
| 2002/0041246 A1 | 4/2002 | Change et al. | 341/152 |
| 2002/0060605 A1 | 5/2002 | Kowkutla et al. | 330/10 |
| 2002/0135419 A1 | 9/2002 | Groves, Jr. et al. | 330/10 |
| 2003/0006838 A1 | 1/2003 | Yeongha et al. | 330/10 |
| 2003/0031245 A1 | 2/2003 | O'Brien | 375/238 |
| 2003/0042868 A1 | 3/2003 | Muramatsu | 320/107 |
| 2003/0122692 A1 | 7/2003 | Roeckner et al. | 5/8 |

FOREIGN PATENT DOCUMENTS

| | | | |
|---|---|---|---|
| JP | 11 31971 | 2/1999 | 3/2 |
| WO | WO 92/11699 | 7/1992 | 1/82 |
| WO | WO 03/047110 | 6/2003 | 1/82 |

OTHER PUBLICATIONS

Midya et al., "Prediction Correction Algorithm for Natural Pulse Width Modulation," Proceedings of the International AES Conference, Sep. 2000, pp. 1-23, XP009008487.

Goldberg et al., "A Digital Signal Processing Algorithm for the Linearisation of PWM Based DACs for Digital Audio Applications," Signal Processing Theories and Applications. Brussels, Aug. 24-27, 1992, Proceedings of the European Signal Processing Conference, Elsevier, NL, vol. 3, Conf. 6, pp. 1705-1708, XP000356576.

Bresch et al.: "TMS320C67-Based Design of a Digital Audio Power Amplifier Introducing Novel Feedback Strategy", Rose-Hulman Institute of Technology, Electrical and Computer Engineering Department, 2001.

Streitenberger et al.: "Zero-Position Coding (ZePoC)-A Generalised Concept of Pulse-Length Modulated Signals and its Application to Class-D Audio Power Amplifiers", Audio Engineering Society Convention Paper 5365, May 12-15, 2001.

PCM-TO-PWM CONVERTER

PRIORITY INFORMATION

This application claims priority to U.S. provisional patent application serial number 60/487,000 filed Jul. 14, 2003 and German patent application DE10337782.4 filed Aug. 14, 2003. Both applications are hereby incorporated by reference.

BACKGROUND OF THE INVENTION

The invention relates to PCM-to-PWM signal conversion, and in particular to the correction of non-linearities and noise in the digital conversion of a PCM signal into a PWM signal.

It is known that the comparison of an analog signal amplitude with the amplitude of a higher-frequency reference signal (e.g., a sawtooth waveform) results in a 1-bit digital or pulse width modulated (PWM) signal. This PWM signal can be converted back into an analog signal using a D/A converter. For PWM signals the D/A converter can be a relatively simple lowpass filter.

In this classical PWM circuit, the crosspoint between the analog input signal and the reference sawtooth is used to switch the comparator output between a High (1) and a Low (0). The resulting PWM is called naturally sampled PWM (NPWM). NPWM does not create direct harmonics of the input signal, but only high-frequency inter modulation products between the input and the reference signal, which will be filtered in the D/A process by the lowpass filter.

It has also been known that a successful implementation of a digital PCM-to-PWM conversion needs to mimic the behavior of the above described analog circuit as exact as possible.

Published international patent application No. WO92/11699, incorporated herein by reference, discloses a method of PCM-to-PWM conversion that mimics the above described analog circuit in the digital domain by calculating the crosspoint using a Newton-Raphson Iteration based on a polynomial interpolation of the discrete input signal. Realized as a real time application specifically for class-D amplifiers this method needs a large amount of processing power.

The published international patent application No. WO97/37433, incorporated herein by reference, discloses a method of modeling and therefore predicting the non-linearity of a pulse code modulation to pulse width modulation conversion process. In this model the use of a so-called Hammerstein filter is proposed as a suitable method of correcting several errors of the conversion process. For real-time audio applications (with a bandwidth of 20 Hz . . . 20 kHz), where for practical reasons the PWM pulse repeating frequency is between 200 kHz and 400 kHz, the necessary computing power is still quite large.

A different method has been published by Streitenberger et al. (Zero Position Coding (ZePoC)—A Generalised Concept of Pulse-Length Modulated Signals and its application to Class-D Audio Power Amplifiers, 110$^{th}$ AES Convention, May 12-15, 2001). This paper is incorporated herein by reference. This method uses analytical exponential modulation to generate the PWM signal that results in a lower pulse-repeating frequency (less than 100 kHz for audio applications). The discussed audio implementation needed three DSP engines to process this complex method with a total computing power of 233 MMACs.

It is also known that the non-linearities of the PCM-to-PWM conversion process can be compensated using various feedback techniques combined with adaptive filtering (e.g., TRIPATH White Paper, Apr. 12, 1999). Digital PWM methods are known which calculate the PWM pulse widths from discrete sampling values of the continuous input signal.

Also known is a so-called UPWM (uniform sampling pulse width modulation) method which calculates the pulse widths linearly from (PCM-type) sampling values. However, since the subsequent digital-to-analog conversion of the thus generated PWM signal is a nonlinear process, the entire UPWM method produces large nonlinearities.

German Patent DE 101 56 744 A1 discloses a method in which intermediate values are interpolated for the individual PCM signal values, and in which comparison values are determined in a ramp function relative to the corresponding sampling nodes. An evaluation unit to generate the PWM signal compares the interpolated PCM signal values using the comparison values which follow a ramp pattern. Ultimately, this method too follows the fundamental principle of a method in which an analog or digitized signal amplitude is compared with the amplitude of a higher-frequency reference signal, for example, a saw-tooth signal, in order to generate a pulse-width-modulated signal. Such a signal may be converted back into an analog signal using a digital-to-analog converter. When PWM signals are used, the digital-to-analog converter may consist essentially of a relatively simple low-pass filter. In the classical (analog) PWM circuit, the precise intersection between the input signal and the reference signal is used to connect a comparator in the form of a comparison circuit in order to switch the output signal value between two discrete states. What is generated is the naturally sampled PWM signal (NPWM). After the digital-to-analog conversion, the NPWM signal does not contain any direct harmonic oscillations of the input signal but only higher-frequency inter modulation products between the input signal and the reference signal which are filtered out in the analog-to-digital process by the low-pass filter. Digital PCM-to-PWM conversion circuits, such as that described in DE 101 56 744 A1, must mimic the response of a corresponding analog circuit as precisely as possible. Currently, limitations arise in terms of real-time applications due to the requisite processing time and the pulse width resolution or number of bits. To deal with this, a variety of methods are known, which will be described below.

A method for converting PCM data to PWM data consists in linearly transforming each PCM signal value or PCM sampling value to a corresponding PWM pulse width, as described, for example, by Erik Bresch and Wayne T. Padgett, ("TMS320C67-Based Design of a Digital Audio Power Amplifier Introducing Novel Feedback Strategy"). This transformation involves the so-called uniformly sampled pulse-width modulation (UPWM). However, this method generates a large number of direct harmonic oscillations of the original signal and is thus not suitable for audio applications.

When the PWM sampling period approaches zero, the difference between the pulse widths using UPWM and NPWM decreases to zero for the same input waveform. This is the equivalent of an infinitely large PWM pulse rate.

In order to keep the output low-pass filter simple, the preferred pulse rate is at least 10-20 times the bandwidth of the sampled output signal. For audio applications, the typical bandwidth is 20 kHz, so that the pulse rate employed ranges from 200 kHz to 400 kHz. A higher pulse rate is preferred; however, the efficiency of these power switches beyond 1 MHz declines drastically, thereby reducing the general advantage of a digital switching amplifier. As a result, pulse rates between 200 kHz and 1.5 MHz are preferred in practice.

Another factor is the minimal pulse width. Since in a digital system, only discrete pulse widths are possible, the minimal pulse width determines the resolution, and thus the PWM clock rate. For a PWM pulse rate of 384 kHz and a resolution of 16 bits, that is, CD quality, the PWM clock rate would be 384 kHz×$2^{16}$, or 25.16 GHz. A clock rate this high is obviously not processable in practical terms. In making PWM amplifiers, specifically, for audio applications, a variety of methods have been proposed to overcome these limitations.

A problem with known techniques is that the computational power needed for real time audio applications is still enormous. Except for the ZePoC method this is due to the fact that the PCM-to-PWM conversion has to be done at the final pulse repeating frequency of 200 . . . 400 kHz, which often makes a high order oversampling filter necessary if a primary sampling rate of between 32 kHz and 48 kHz is to be used. In case of the ZePoC method the overall computational power is too high, specifically for so-called single-chip multi-channel solutions.

SUMMARY OF THE INVENTION

Briefly, according to an aspect of the invention, a PCM-to-PWM converter includes a first oversampling device that oversamples a PCM signal and provides a first oversampled signal. A compensation unit receives the first oversampled signal and provides a PWM signal. A second oversampling device receives the PWM signal and oversamples said PWM signal to provide a PWM output signal.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
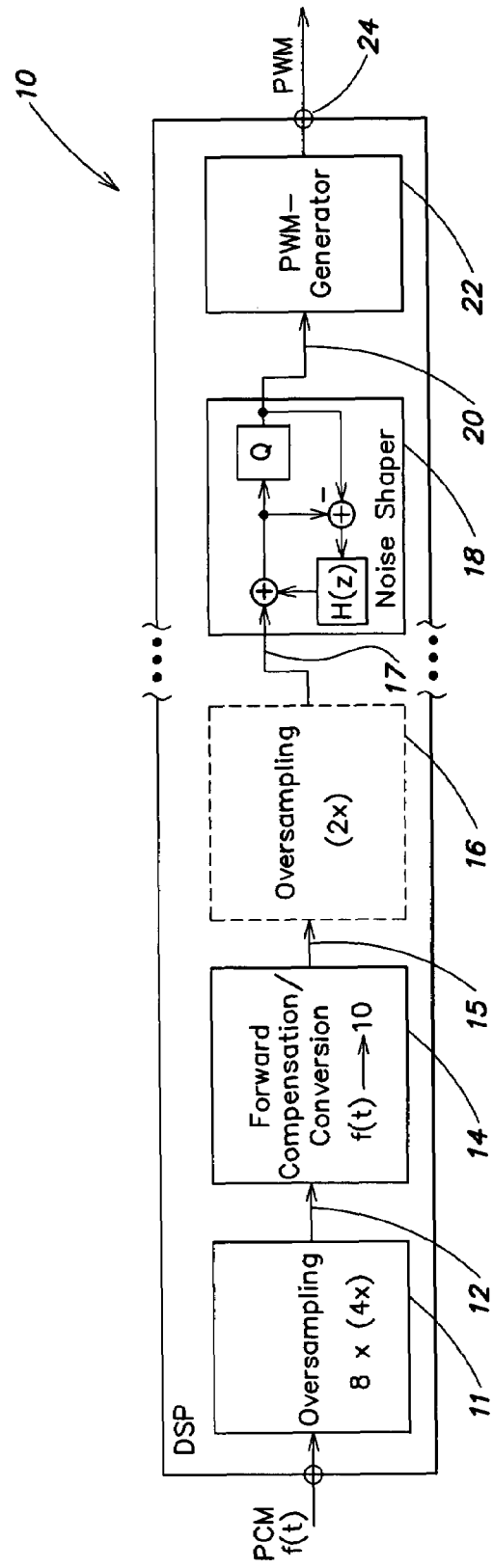
FIG. 1 is a block diagram illustration of a PCM-to-PWM converter.

FIG. 1 is a block diagram illustration of a PCM-to-PWM converter 10. The converter 10 may be configured and arranged as part of a digital signal processor (DSP). The converter 10 receives a PCM signal sampled at $f_s$, and the received signal is upsampled in an upsampler 11 to match the sampling rate to the requirements of the subsequent conversion. The PCM signal may be, for example, from a music wave such as from a compact disc (CD). In one embodiment for example, 8-times oversampling is provided. The upsampler 11 (i.e., oversampler) provides a signal on a line 12 to a PCM-to-PWM conversion unit 14.

The PCM-to-PWM conversion unit 14 provides forward compensation to calculate a digital pulse-width-modulated (PWM) signal from the PCM signal. The conversion unit 14 pre-compensates the inherent nonlinearities of the final PWM digital-to-analog processing of the converter 10. The unit 14 utilizes non-iterative processing and employs multiplications and additions, or subtractions, for efficient processing within the DSP. This is particularly advantageous since divisions require significantly more processing power than multiplication and addition operations.

The forward compensation of nonlinearities utilizes an intersection approximation through a calculation and combination of individual terms based on the input signal or input signal values, and their $n^{th}$-order derivatives. In contrast to the iterative process disclosed in published international application WO92/11699, a non-iterative process is employed in which the digital signal f(t) is used with its weighted $n^{th}$-order derivatives as linear and nonlinear terms for the forward compensation. Specifically, the pulse width is determined using the following equation:

$$\text{pulse width}(PWM) = a0 + f(t)\left(\sum_{i1}\sum_{i2}\sum_{i3}\cdots\sum_{in} b_{i1i2i3-in}\cdot f(t)^{i1}\cdot f(t)^{i2}\cdot f(t)^{i3}\cdot\ldots\cdot f^{(n)}f(t)^{in}\right) \quad \text{EQ. 1}$$

Here a0, $b_{i1}$, $b_{i2}$, $b_{i3}$ . . . $b_{in}$ are weighting factors, the index i1, i2, . . . in, represent for the I-th data value of the signal or signal value of the time function sequence f(t) of the digital input signal, and f', f", . . . $f^{(n)}$ represent the first, second, . . . $n^{th}$ derivative of the function f(t) that represents the digital signal sequence. In contrast to the subject matter disclosed in published international patent application WO 97/37433, the individual components are not filtered subsequently by linear and time-invariant filters, and also do not represent a Taylor series of nonlinearities.

The converter 10 may used be in audio applications. Examples of appropriate data include an audio bandwidth of 20 Hz-20 kHz with a signal/noise ratio of greater then 90 dB and a total harmonic distortion plus noise value of 0.1%. For these applications, the equation set forth above may be reduced to only a few significant terms. In addition, weighting factors a0, b0, b1, b2, . . . may be realized at only a low bit resolution without quantization errors.

An example of an empirically reduced set of terms for an implementation using terms up to $2^{nd}$-order derivatives is provided by the expression:

$$t0=a0+f(t)(b0+b1f'(t)+b2f'(t)^2+b3f(t)\cdot f''(t)) \quad \text{EQ. 2}$$

Here f(t) is the signal amplitude of the digital input signal, f'(t) is the first derivative of this signal f(t), f"(t) is the second derivative of this signal, a0, b0, b1, b2, b3 are weighting factors, in this case preferably empirically determined constants, and t0 is the PWM pulse width. It is evident here that multiplications of the original signal amplitude or of the input signal are performed not only using pure $n^{th}$-order derivatives but using the mixed terms in which, for example, factors both the second-order derivative and additionally the $0^{th}$-order derivative are contained.

Figure 2A:
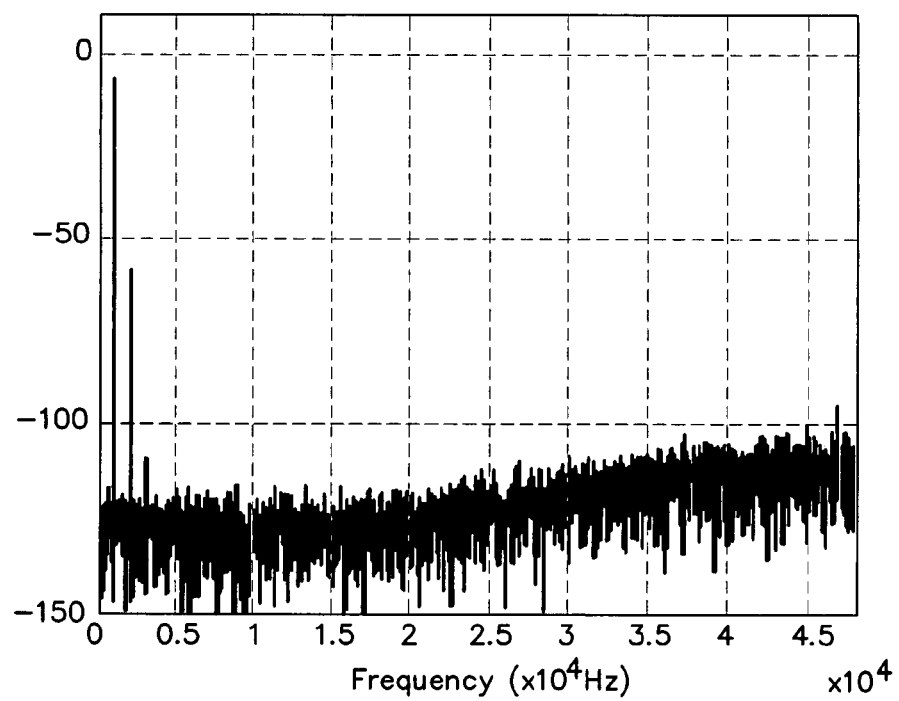
FIGS. 2A and 2B illustrate two amplitude spectra for a typical application in the audio field for the prior art uniform sampling pulse width modulated (UWPM) method, and for signal processing using the converter of FIG. 1, respectively.
Figure 2B:
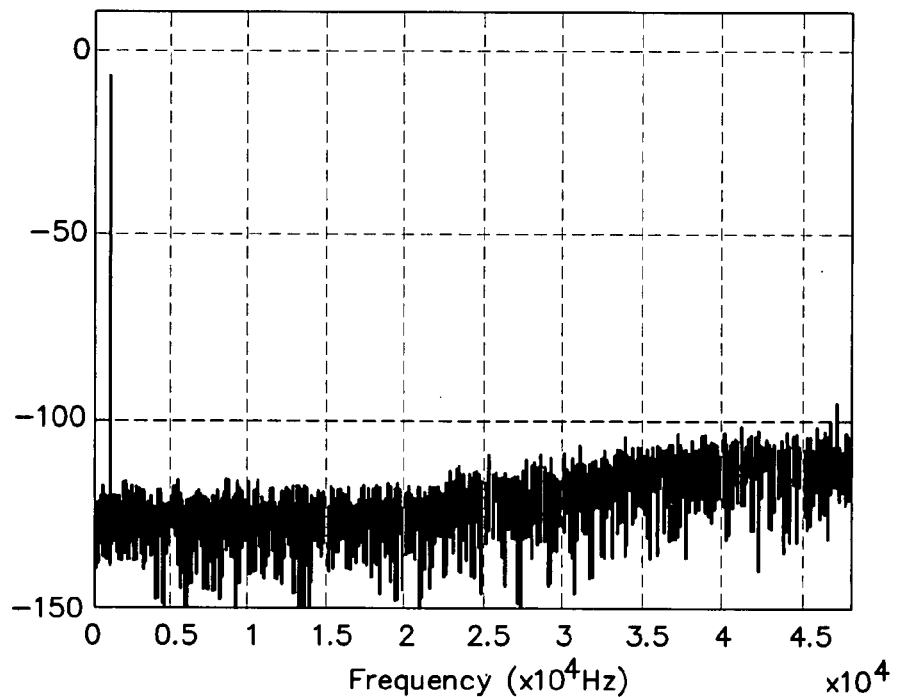

FIGS. 2A and 2B illustrate two amplitude spectra for a typical application in the audio field for the prior art uniform sampling pulse width modulated (UWPM) method, and for signal processing using the converter 10 of FIG. 1, respectively. The amplitude spectrum corresponds to a 1 kHz signal from a frequency range of 0-50 kHz for a corresponding PCM-to-PWM converter. FIG. 2A shows large harmonic oscillation components in the low frequency range, as usually occur during conversion using the prior art technique of UPWM. These cannot be filtered out subsequently since they are located in the frequency band of interest. FIG. 2B shows the spectrum of a conversion using the converter 10 (FIG. 1) based on the empirically reduced EQ. 2 set forth above. The good linearity of the conversion process is illustrated in FIG. 2B—that is, no larger harmonic oscillations occur and thus do not have to be taken into account, or have to be taken into account only to a limited degree, in a subsequent signal processing operation.

The above-described PCM-to-PWM conversion for compensating nonlinearities may be used in a digital amplifier. Especially advantageous is a digital amplifier that utilizes this compensation technology and linearization technology in a transfer function H(z) of the feedback path for noise shaper 18.

The converted signal on the line 15 may then be fed to a noise shaper 18, which implements noise shaping or noise reduction. The noise shaper 18 provides a filtered signal on a line 20 that is fed to a PWM generator 22, which provides the actual pulse-width-modulated signal on a line 24.

The converter 10 may also include a second oversampling device 16 that is operably positioned between the conversion unit 14 and the noise shaper 18. The second oversampling device 16 provides a second oversamped signal on line 17 that is provided to the noise shaper 18, or alternatively directly to the PWM generator 24 thus bypassing the noise shaper 18. This approach offers the possibility of performing a lower-rate oversampling, such as 4-times, instead of the 8-times oversampling. This first oversampling provided by the first oversampler 11 is selected such that the sampling rate or node rate is sufficient for the conversion in the conversion unit 14, with the result that based on the reduced conversion rate fewer calculation steps have to be implemented. The second oversampling device 16 then increases the sampling rate to the requirements of the additional data signal processing in the noise shaper 18 and/or in the PWM generator 22. Splitting the oversampling between two separate components or process steps, whether before or after conversion of the digital signal in the converter unit 14, may in principle also be advantageously applied to other conversion techniques in addition to the technique described herein. In regard to oversampling filters, already known FIR or IIR methods and systems, as well as other known interpolations methods, may be employed.

The second oversampling filter 16 allows a PCM-to-PWM converter with the lowest possible signal rate and a follow-on simple post-oversampling filter to be used, such that the ultimately required PWM pulse rate or PWM repetition rate is obtained. This approach reduces the required processing power for the PCM-to-PWM converter. In this embodiment a 4-times oversampling filter 411 is located before the conversion circuit 14 and a 2-times oversampling filter 16 is located after the conversion circuit 14. In this example, in addition to the required computing power, the processing time for the PCM-to-PWM conversion is reduced as well since only one signal or data sequence must be processed at half the signal rate.

Although the present invention has been shown and described with respect to several preferred embodiments thereof, various changes, omissions and additions to the form and detail thereof, may be made therein, without departing from the spirit and scope of the invention.

What is claimed is:

1. A method for converting a digital pulse-code-modulated signal to a pulse-width-modulated signal, comprising the steps of:

multiplying the digital pulse-code-modulated signal by at least one derivative of the pulse-code-modulated signal to provide an oversampled signal indicative thereof, and converting the oversampled signal to the pulse-width-modulated signal, where the pulse-width modulated sianal is formed from linear and/or nonlinear terms, where at least some of the terms have a higher-order derivative.

2. The method of claim 1, where the pulse-width-modulated signal is formed from terms with lower-order derivatives.

3. The method of claim 1, where the at least one derivative is weighted by weighting factors.

4. The method of claim 3, where the weighting factors have a resolution of a few bits.

5. The method of claim 1, where an empirically reduced set of terms is used in the step of multiplying according to the equation $$t0 = a0 + f(t)(b0 + b1 f'(t) + b2 f'(t)^2 + b3 f(t) \cdot f''(t)),$$

where f(t) is the signal amplitude of the digital pulse-code-modulated signal, f'(t) is the first derivative of the digital pulse-code-modulated signal f(t); f''(t) is the second derivative of the digital pulse-code-modulated signal, and a0, b0, b1, b2, b3 are weighting factors.

6. The method claim 1, where the step of multiplying is implemented noniteratively and division-free through additions and multiplications.

7. Method for converting a digital coded signal (PCM), specifically, a pulse-coded signal, to a pulse-width-modulated signal (PWM), specifically, wherein to obtain a sampling rate sufficient for the pulse-width-modulated signal an oversampling of the digital signal is implemented with a required oversampling factor, characterized in that an oversampling is implemented with an oversampling factor before the conversion and an additional oversampling factor after the conversion, such that the product of the oversampling factors before and after conversion of the digital signal to the pulse-width-modulated signal corresponds at least to the value of the ultimately required oversampling factor.

8. A device for converting a digital pulse-code-modulated signal to a pulse-width-modulated signal, comprising:

a circuit that calculates the pulse-width-modulated signal from terms using derivatives of the digital pulse-code-modulated signal and multiplications of the derivatives by the digital pulse-code-modulated signal, where the terms are linear and/or nonlinear, and where at least some of the terms have a higher-order derivative.

9. The device of claim 8, where the circuit includes multiplication elements, addition elements, and intermediate storage devices.

10. The device of 8, where the circuit calculates the pulse-width-modulated signal without division elements.

11. A PCM-to-PWM converter, comprising:

a first oversampling device for oversampling a PCM signal and providing a first oversampled signal;

a compensation unit that receives said first oversampled signal and provides a PWM signal; and a second oversampling device that receives said PWM signal and oversamples said PWM signal to provide a PWM output signal.

12. A method for converting a digital pulse-code modulated signal to a pulse-width-modulated signal, comprising the steps of:

multiplying the digital pulse-code-modulated signal by at least one derivative of the pulse-code-modulated signal to provide an oversampled signal indicative thereof converting the oversampled signal to the pulse-width-modulated signal according to the expression, $$t0 = a0 + f(t)(b0 + b1 f'(t) + b2 f'(t)^2 + b3 f(t) \cdot f''(t)),$$

wherein f(t) is the signal amplitude of the digital pulse-code-modulated signal, f'(t) is the first derivative of the digital pulse-code-modulated signal f(t); f''(t) is the second derivative of the digital pulse-code-modulated signal, and a0, b0, b1, b2, b3 are weighting factors.

13. A device for converting a digital pulse-code-modulated signal to a pulse-width-modulated signal, comprising:
a first oversampling circuit that oversamples the pulse-code-modulated signal using a first oversampling factor and provides a first oversampled signal indicative thereof; and
a forward compensation conversion circuit, responsive to the oversampled signal, that calculates the pulse-width-modulated signal from terms using a plurality of derivatives of the digital pulse-code-modulated signal and multiplications of the plurality of derivatives by the digital pulse-code-modulated signal.

14. The device of claim 13, further comprising a second oversampling circuit, responsive to the pulse-width-modulated signal, that oversamples the pulse-width-modulated signal using a second oversampling factor and provides a second oversampled signal indicative thereof.

15. The device of claim 14, further comprising a noise shaper circuit, responsive to the second oversampled signal, for shapes or reduces any noise in the second oversampled signal and provides a noise shaped signal indicative thereof.

16. The device of claim 13, further comprising a pulse-width-modulated generator circuit, responsive to the calculated pulse-width-modulated signal, that provides the pulse-width modulated signal.

17. The device of claim 14, further comprising a pulse-width-modulated generator circuit, responsive to the second oversampled signal, that provides the pulse-width-modulated signal.

18. The device of claim 15, further comprising a pulse-width-modulated generator circuit, responsive to the noise shaped signal, that provides the pulse-width-modulated signal.

* * * * *

UNITED STATES PATENT AND TRADEMARK OFFICE
CERTIFICATE OF CORRECTION

PATENT NO. : 7,317,758 B2  Page 1 of 1
APPLICATION NO. : 10/892531
DATED : January 8, 2008
INVENTOR(S) : Herbert Alrutz It is certified that error appears in the above-identified patent and that said Letters Patent is hereby corrected as shown below:

Column 1
Line 29, delete "inter modulation" and insert --intermodulation--

Column 2
Line 36, delete "inter modulation" and insert --intermodulation--

Column 4
Line 29, delete "represent" and insert --represents a running index--

Column 5
Line 52, delete "411" and insert --11--

Column 6
Line 3, delete "thereof," and insert --thereof;--
Line 7, delete "sianal" and insert --signal--
Line 28, after "method" insert --of--
Line 54, after "of" insert --claim--

Signed and Sealed this

Twenty-ninth Day of April, 2008

JON W. DUDAS
*Director of the United States Patent and Trademark Office*